(12) United States Patent
Bhansali et al.

(10) Patent No.: US 7,255,800 B1
(45) Date of Patent: Aug. 14, 2007

(54) WET ETCHING PROCESS

(75) Inventors: Shekhar Bhansali, Tampa, FL (US); Abdu Rub Abdur, Temple Terrace, FL (US); Sunny Kedia, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 10/710,984

(22) Filed: Aug. 16, 2004

Related U.S. Application Data

(60) Provisional application No. 60/481,233, filed on Aug. 15, 2003.

(51) Int. Cl.
*B44C 1/22* (2006.01)
(52) U.S. Cl. .............................. 216/2; 216/41; 216/51; 216/56; 216/87; 216/99
(58) Field of Classification Search ..................... None
See application file for complete search history.

(56) References Cited

U.S. PATENT DOCUMENTS

| | | | | |
|---|---|---|---|---|
| 5,830,777 A | * | 11/1998 | Ishida et al. | 438/50 |
| 6,020,250 A | * | 2/2000 | Kenney | 438/422 |
| 6,139,758 A | * | 10/2000 | Tu | 216/2 |
| 6,358,861 B1 | * | 3/2002 | Ohji et al. | 438/746 |

* cited by examiner

*Primary Examiner*—Anita Alanko
(74) *Attorney, Agent, or Firm*—Molly L. Sauter; Smith & Hopen, P.A.

(57) ABSTRACT

The present invention illustrates a bulk silicon etching technique that yields straight sidewalls, through wafer structures in very short times using standard silicon wet etching techniques. The method of the present invention employs selective porous silicon formation and dissolution to create high aspect ratio structures with straight sidewalls for through wafer MEMS processing.

12 Claims, 5 Drawing Sheets

WET ETCHING PROCESS

CROSS REFERENCE TO RELATED APPLICATIONS

This application claims priority to U.S. Provisional Patent Application No. 60/481,233, "Wet Etching Process", filed Aug. 15, 2003.

STATEMENT OF GOVERNMENT INTEREST

The work that led to this invention has been supported in part by a grant from the National Science Foundation, Contract No. NSF Career 0239262. Thus, the United States Government may have certain rights to this invention.

BACKGROUND OF INVENTION

MEMS devices are based on using microelectronic wafer fabrication techniques to produce complex shapes in the µm to mm size range with embedded sensors, actuators and circuitry. More than a dimension, MEMS is a way of manufacturing. Presently two types of bulk silicon etching are predominantly used namely, wet and dry etching. Wet etching while offering process simplicity and low cost requires long hous for etching and results in sharp corners and 54.7-degree side wall angles. Dry etching technique namely the Deep reactive Ion etching (DRIE) overcomes the difficulties of wet etching allowing for arbitrary shapes but in an expensive process.

Thus there is a need for an etching technique which offers the simplicity of the wet etching and the process capabilities of dry etching. Such a technique will result in high aspect ratio anisotropic structures without any sidewall angles in a short period of time using standard wet etching methods.

SUMMARY OF INVENTION

The present invention provides a novel wet etching process useful in the fabrication of MEMS devices. In accordance with the present invention, a bulk silicon etching method is provided including the steps of, providing a silicon wafer, diffusing the wafer with dopant, whereby the diffusion creates a PN-junction throughout the surface of the wafer, providing a mask, positioning the mask in overlying relation to the surface of the wafer, applying a layer of oxide on the surface of the wafer, patterning a layer of oxide on the surface of the wafer, etching the wafer to create recessed areas coincident with the patterned oxide, the recessed areas characterized by the absence of surface PN-junction, hydrofluoric acid etching the wafer to form porous silicon thereon, whereby the porous silicon is formed coincident with the surface wafer area characterized by the absence of surface PN-junction, and subjecting the wafer surface to wet etching resulting in dissolution of the porous silicon.

In a particular embodiment, the silicon wafer is an N-type silicon wafer and the dopant is a P-type dopant. Alternatively, the wafer may be a P-type silicon wafer and the dopant may be an N-type dopant.

Various techniques are within the scope of the present invention for patterning the oxide layer on the surface of the wafer, including, but not limited to, sputtering.

Various techniques are within the scope of the present invention for etching the oxide patterned on the wafer, including, but not limited to, etching with potassium hydroxide (KOH). In a particular embodiment the step of etching the oxide is accomplished by subjecting the wafer to potassium hydroxide etching for approximately ten minutes.

There are various techniques within the scope of the present invention for etching the porous silicon, including, but not limited to, etching with potassium hydroxide (KOH) and etching with tetramethyl ammonium hydroxide (TMAH). In a particular embodiment, the porous silicon is subjected to etching utilizing either KOH or TMAH for approximately thirty seconds.

The method of the present invention provides significant lowering of fabrication costs through the utilization of cost effective wet etching techniques.

The present invention discloses an etching technique which offers the simplicity of wet etching and the process capabilities of dry etching. As such, the method of the present invention results in the rapid fabrication of high aspect ratio anisotropic structures substantially devoid of sidewall angles. Accordingly, the method presented is an alternative to deep reactive ion etching.

BRIEF DESCRIPTION OF DRAWINGS

For a fuller understanding of the nature and objects of the invention, reference should be made to the following detailed description, taken in connection with the accompanying drawings, in which.

DETAILED DESCRIPTION OF INVENTION

The present invention illustrates a bulk silicon etching technique that yields straight sidewalls, through wafer structures, in very short times using standard silicon wet etching techniques. In accordance with the present invention, a method employing selective porous silicon formation and dissolution is used to create high aspect ratio structures with straight sidewalls for through wafer MEMS processing.

Figure 1:
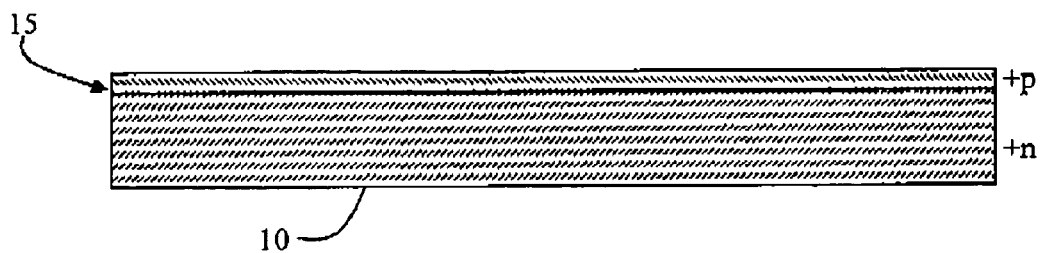
FIG. 1 is a cross-sectional illustration of a silicon wafer having a blanket PN-junction throughout the surface of the wafer in accordance with the present invention.

In an exemplary embodiment, referring to FIG. 1, an N-type silicon wafer 10 is diffused with P-type dopant to the order of 1020 atoms/cm2. Other ratios are additionally within the scope of the present invention. The diffusion creates a blanket PN-junction 15 through out the surface of the wafer.

Figure 2:
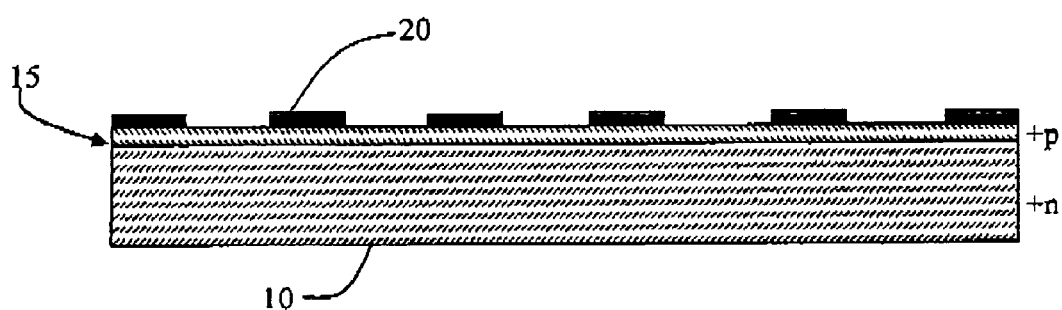
FIG. 2 is a cross-sectional illustration of a silicon wafer patterned with oxide in accordance with the present invention.

A thin layer of oxide 20 is then sputtered and patterned using the desired mass on top of the diffusion, as shown with reference to FIG. 2.

Figure 3:
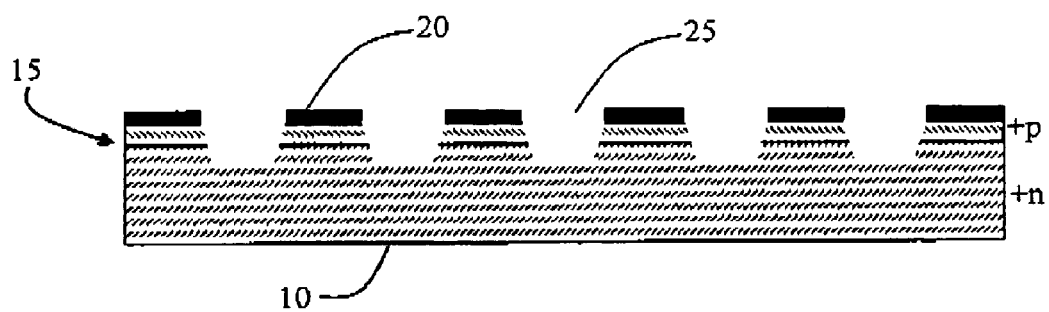
FIG. 3 is a cross-sectional illustration of a silicon wafer after the oxide patterned wafer has been subjected to KOH etching in accordance with the present invention.

The wafer is then subjected to KOH etching for ten minutes to create recessed areas 25 where the oxide was patterned, as shown with reference to FIG. 3. The patterning of oxide and the silicon beneath creates patterns of the surface, which are contrasted by the presence and absence of PN-junction.

Figure 4:
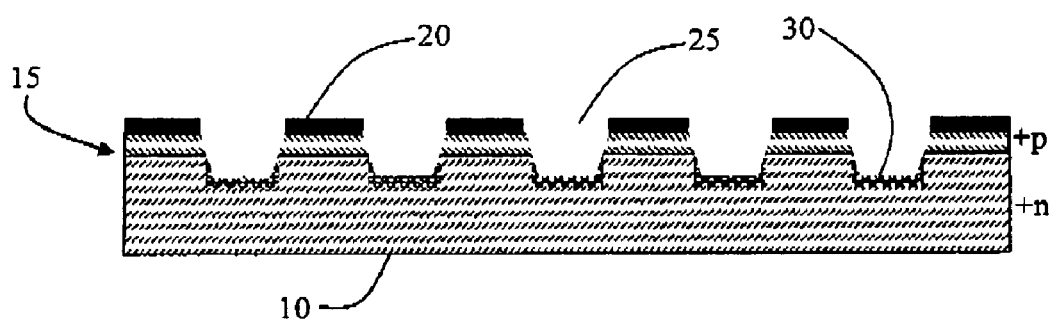
FIG. 4 is a cross-sectional illustration of a silicon wafer after the wafer surface has been subjected to hydrofluoric acid electrochemical etching to form porous silicon in accordance with the present invention.
Figure 5:
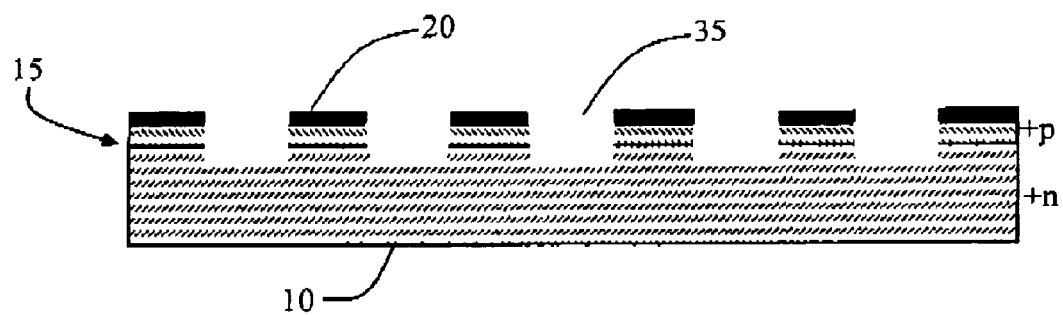
FIG. 5 is a cross-sectional illustration of a silicon wafer, having selective porous silicon, after the wafer has been subjected to KOH etching, resulting in through wafer high aspect ration structures with straight sidewalls.

As shown in FIG. 4, porous silicon 30 is formed on the patterned wafer using HF based electrochemical etching technique. The pores are formed in areas that are characterized by the absence of surface junction. In the areas which have a surface junction, the junction blocks the pore initiation and propagation due to lack of holes in the depletion region, which are essential to porous silicon formation. The resultant wafer is selectively porous in the areas where the oxide was patterned and the rest of the wafer is bulk silicon.

This wafer is further subjected to KOH or TMAH etching for thirty seconds which results in rapid dissolution of porous areas, leaving behind bulk silicon, thus resulting in through wafer high aspect ration structures with straight sidewalls 35. The drastic reduction in etching time is due to the fact that in the porous areas the etching chemical encounters much higher surface area than in the non-porous areas, thus leading to very high selectivity.

It will be seen that the objects set for the above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also understood that the following claims are intended to cover all of the generic and specific features of the invention herein described, and all statements of the scope of the invention which, as a matter of language, might be said to fall therebetween. Now that the invention has been described.

The invention claimed is:

1. A bulk silicon etching method comprising the following steps in the order named:
   (a) providing a silicon wafer;
   (b) diffusing the wafer with dopant, whereby the diffusion creates a PN-junction at a predetermined PN-junction depth throughout the surface of the wafer;
   (c) providing a mask;
   (d) positioning the mask in overlying relation to the surface of the wafer;
   (e) patterning a layer of oxide on the surface of the wafer, whereby the pattern of the oxide layer is defined by the mask;
   (f) etching the wafer to create recesses in the wafer in the areas that are not patterned with the oxide layer, whereby the etching step is sufficient to etch away the wafer to a depth below the PN-junction depth created by the diffusion step, thereby creating recessed areas having sidewalls, the sidewalls characterized by the presence of the PN-junction above the PN-junction depth and the absence of the PN-junction below the PN-junction depth;
   (g) hydrofluoric acid etching the wafer to form porous silicon thereon, whereby the porous silicon is formed in the sidewalls of the recessed areas characterized by the absence of the PN-junction; and
   (h) subjecting the wafer to wet etching resulting in dissolution of the porous silicon.

2. The method of claim 1, wherein the silicon wafer is an N-type silicon wafer.

3. The method of claim 1, wherein the dopant is a P-type dopant.

4. The method of claim 1, wherein the silicon wafer is a P-type silicon wafer.

5. The method of claim 1, wherein the dopant is an N-type dopant.

6. The method of claim 1, wherein the step (e) of patterning a layer of oxide on the surface of the wafer further comprises sputtering the oxide layer.

7. The method of claim 1, wherein the step (f) of etching the wafer further comprises etching the wafer with potassium hydroxide.

8. The method of claim 7, further comprising etching the wafer with potassium hydroxide for about ten minutes.

9. The method of claim 1, wherein the step (h) of subjecting the wafer surface to wet etching, further comprises subjecting the wafer surface to potassium hydroxide.

10. The method of claim 1, wherein the step (h) of subjecting the wafer surface to wet etching, further comprises subjecting the wafer surface to tetramethyl ammonium hydroxide.

11. The method of claim 9, wherein the wafer surface is subjected to potassium hydroxide for about thirty seconds.

12. The method of claim 10, wherein the wafer surface is subjected to tetramethyl ammonium hydroxide for about thirty seconds.

* * * * *

UNITED STATES PATENT AND TRADEMARK OFFICE
CERTIFICATE OF CORRECTION

PATENT NO.         : 7,255,800 B1                                             Page 1 of 1
APPLICATION NO. : 10/710984
DATED                  : August 14, 2007
INVENTOR(S)        : Shekhar Bhansali, Abdu Rub Abdur Rahman and Sunny Kedia It is certified that error appears in the above-identified patent and that said Letters Patent is hereby corrected as shown below:

Title Page Item [75], Inventors, "Abdu Rub Abdur" should be changed to --Abdu Rub Abdur Rahman--

Signed and Sealed this

Second Day of December, 2008

JON W. DUDAS
*Director of the United States Patent and Trademark Office*